US 6,639,838 B2

(12) United States Patent
Fournel et al.

(10) Patent No.: US 6,639,838 B2
(45) Date of Patent: Oct. 28, 2003

(54) NON-VOLATILE MEMORY ARCHITECTURE AND INTEGRATED CIRCUIT COMPRISING A CORRESPONDING MEMORY

(75) Inventors: Richard Fournel, Lumbin (FR); Sigrid Thomas, Grenoble (FR); Cyrille Dray, Eybens (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 10/139,621

(22) Filed: May 6, 2002

(65) Prior Publication Data

US 2002/0186599 A1 Dec. 12, 2002

(30) Foreign Application Priority Data

May 7, 2001 (FR) .............................................. 01 06091

(51) Int. Cl.[7] .............................................. G11C 16/06
(52) U.S. Cl. ............................. 365/185.23; 365/185.11; 365/185.25
(58) Field of Search ....................... 365/185.23, 185.11, 365/185.25

(56) References Cited

U.S. PATENT DOCUMENTS

| 5,185,718 | A | | 2/1993 | Rinerson et al. ............. 365/185 |
| 5,400,276 | A | | 3/1995 | Takeguchi ................... 365/149 |
| 5,467,310 | A | * | 11/1995 | Yoshida et al. ......... 365/185.07 |
| 5,517,044 | A | | 5/1996 | Koyama ..................... 257/316 |
| 5,687,117 | A | * | 11/1997 | Chevallier et al. ..... 365/185.11 |
| 6,175,521 | B1 | * | 1/2001 | Pascucci et al. ....... 365/185.23 |

* cited by examiner

Primary Examiner—Huan Hoang
(74) Attorney, Agent, or Firm—Lisa K. Jorgenson; Allen, Dyer, Doppelt, Milbrath & Gilchrist, P.A.

(57) ABSTRACT

A non-volatile memory architecture with a word-based organization includes one selection transistor per word. This selection transistor is used for the selection of the word by the source of the memory cells. In this way, the selection may be done directly by the ouput signals from the address decoders using low voltage. The switching of a high voltage to the gates and the drains of the memory cells is done independently of this selection. This enables the required number of high voltage switches to be reduced.

36 Claims, 4 Drawing Sheets

NON-VOLATILE MEMORY ARCHITECTURE AND INTEGRATED CIRCUIT COMPRISING A CORRESPONDING MEMORY

FIELD OF THE INVENTION

The present invention relates to a non-volatile memory architecture and to a corresponding integrated circuit. It can be applied especially to EPROM, EEPROM and Flash EPROM type memories.

BACKGROUND OF THE INVENTION

In general, the term non-volatile memory cells must be understood to mean an element capable of memorizing an electrical state, and comprises a control gate with two channel electrodes. A typical example of a non-volatile memory cell comprises a floating-gate MOS transistor. Other types of non-volatile memory cells such as, for example, ferro-magnetic memory cells are known. For clarity of the explanation provided herein, floating-gate MOS transistor memory cells will be used as an example. The two electrodes are then typically the drain and the source of the transistor. The role of these electrodes may be reversed.

Figure 1:
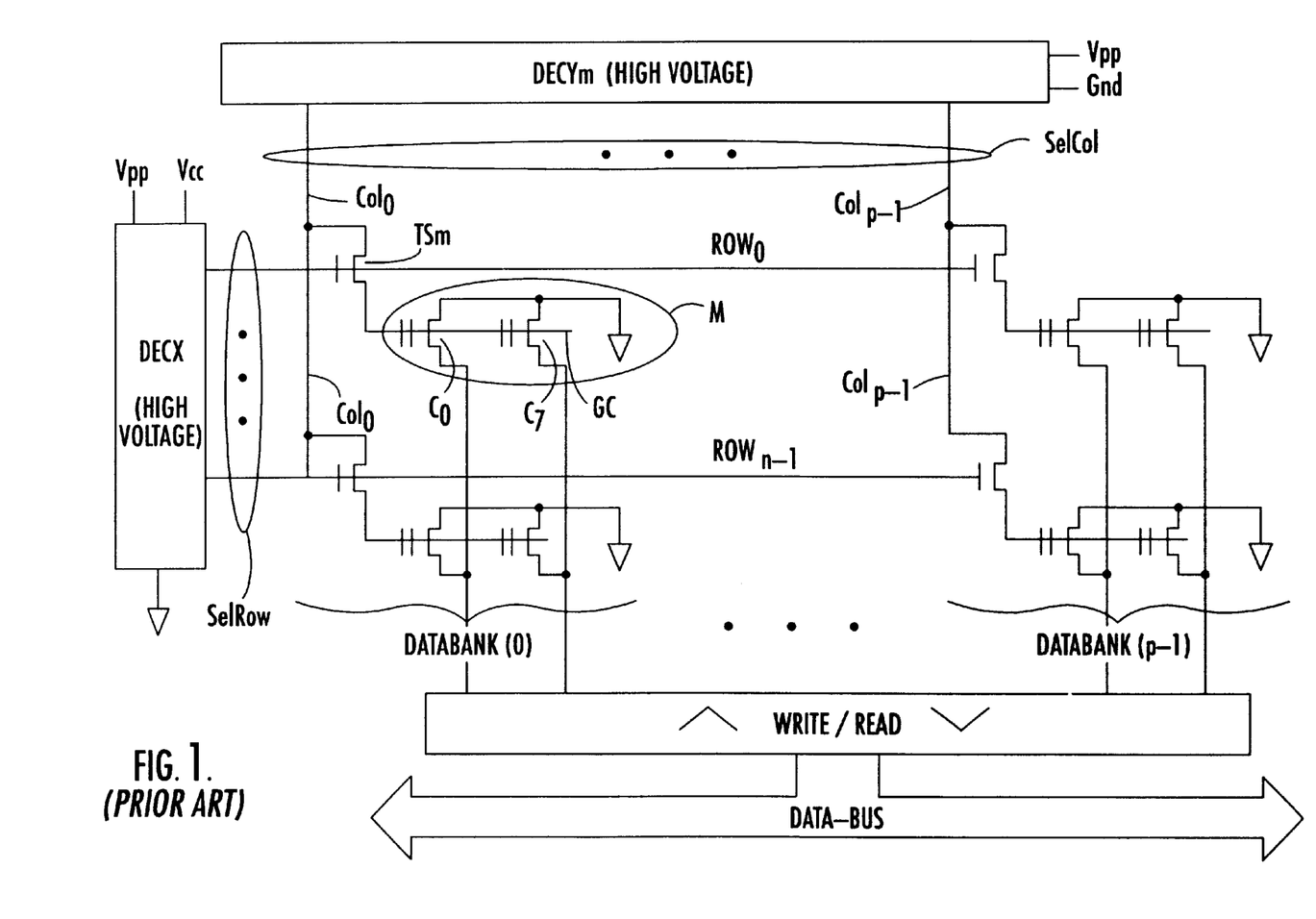
FIG. 1 is a general diagram of an exemplary embodiment of a word-based architecture of a non-volatile memory according to the prior art.

A non-volatile memory is typically organized in the form of data banks DATABANK(0) DATABANK(p−1) in a matrix of rows $Row_0$ to $Row_{n-1}$ and columns $Col_0$ to $Col_{p-1}$, a known exemplary embodiment of which is shown in FIG. 1. In this example, each word has several memory cells grouped together in the same row, and comprises a selection transistor connected to the corresponding row and to the corresponding column. The control gates of the cells of a word are connected in common. Their drains (or their sources) are connected to respective bit lines. Each bit line connects all the drains (or all the sources) of the same ranking cells in a column. It is to these control gates and to these drains that the high-voltage levels needed for the programming of the cells are to be applied.

The selection of a word in a bank of the matrix is-done by the control gate common to the control gates of the memory cells of the word, and by their drains (or their sources) which form the bit lines. Thus, in these architectures, the high-voltage switching and selection functions are linked. For these reasons, the row and column decoders must integrate high-voltage switching circuits, one per column and one per row. Switching circuits associated with the bit lines are also needed. These switches are costly and very bulky.

Furthermore, with regard to the reading of a memory word, it may be recalled that it is usually necessary to plan for a bit line precharging phase. The term precharging must be taken, in the general sense, to mean a charging or discharging of these lines, depending on the memory technology considered. The bit lines play a role in the selection of the memory cells. This precharging phase can be applied only to the bit lines corresponding to the selected word. To successively read several words in the memory (i.e., to carry out multiple readings), the precharging phase must be repeated for each reading. This is very penalizing in terms of reading speed.

SUMMARY OF THE INVENTION

In view of the foregoing background, an object of the present invention is to provide a novel memory architecture that does not have the above-mentioned drawbacks. In particular, an object of the present invention is to reduce the number of high-voltage switching circuits in the memory architecture.

Another object of the present invention is to improve the read access time of a memory, namely the amount of time taken for the data reflecting the state stored in one or more memory cells to become available at an output.

These and other objects, advantages and features according to the present invention are provided by a word-based architecture in which the word-selection function is disassociated from the function of the switching of the high-voltage to the memory cells and, more generally, from the function of the application to the memory cells of voltage levels corresponding to the operation to be performed, namely a reading or programming operation.

According to the invention, the word is selected neither by the control gate of the cells nor by the bit lines which connect the drain of these cells. Thus, according to the invention, the application of a high voltage to the drain and control gate of a memory cell is not sufficient to select this cell in the programming mode. More generally, the application of reading or programming levels of a bias voltage to the gates and drains of cells of the memory is not sufficient for these cells to be selected in a reading or programming mode.

The basic idea of the invention lies in the use of the channel electrode which is not connected to the bit lines. In general, it is the source. However, the source/drain functions may be reversed in certain memory architectures.

Thus, according to the invention, in a memory architecture in which the drains are the channel electrodes and are connected to the bit lines, then each memory word has an associated word selection transistor for selection by the source of the cells. This selection transistor using the source is controlled by the low-voltage address selection signals given by the address decoders of the memory (row decoder and column decoder). The term low-voltage logic level is understood to mean a voltage level lower than or equal to the logic supply voltage Vcc of the integrated circuit. This level depends on the technology considered. For example, this level may be equal to Vcc or to ⅔ of Vcc.

In other words, the output signals from the decoders are applied directly to the selection transistors. The function of the high-voltage switching circuits, therefore, is no longer that of applying the high voltage by selecting the word addressed in the write mode but that of applying the high voltage at least to the word selected by the other circuits.

Since the bit lines and the control gates no longer participate in the selection of the word, it becomes possible to group bit lines with one another and control gates with one another so that they can be controlled at high voltage by the same switching circuit. Each switching circuit can thus control several bit lines or control gates that have been pooled together. Thus, the number of high-voltage switching circuits is considerably reduced.

In particular, the same-ranking bit lines of two distinct word columns and/or the control gates of two distinct rows can be grouped together. The application of the high voltage to the bit line or the control gate of a non-selected column will not affect the associated memory cells, since their source is at a floating potential. The selection transistor is not selected and is non-conductive.

Furthermore, since the bit lines are no longer in the selection path of the cells, it becomes possible to launch the precharging phase of the bit lines to read the memorized words for all the bit lines at the same time. Therefore, each read cycle no longer has any precharging phase. This phase is taken out of the read cycle and is performed before this read cycle, only once. In a multiple-reading operation, the speed of access to the memory is thus appreciably improved.

The invention therefore relates to a non-volatile memory architecture organized in words according to a matrix of rows and columns. A word of the matrix is selected by row-selection and column-selection signals given by address decoders. Each word groups together several memory cells in the same row, and each cell comprises a memory effect MOS transistor with a control gate, a first channel electrode and a second channel electrode. The control gates of the cells of each row of the memory are connected in common to a control gate line, and the first electrode of each cell is connected to a respective bit line. Each word comprises a transistor for the selection of the word by the second electrode of each of its cells. The transistor is controlled by the low-voltage address selection signals given at the output by the decoders.

The invention also relates to an integrated circuit comprising a non-volatile memory with an architecture as described above.

BRIEF DESCRIPTION OF THE DRAWINGS

Other features and advantages of the invention are given in detail in the following description, made by way of an indication that does not restrict the scope of the invention and with reference to the following drawings, of which.

DETAILED DESCRIPTION OF THE PREFERRED EMBODIMENTS

Figure 2:
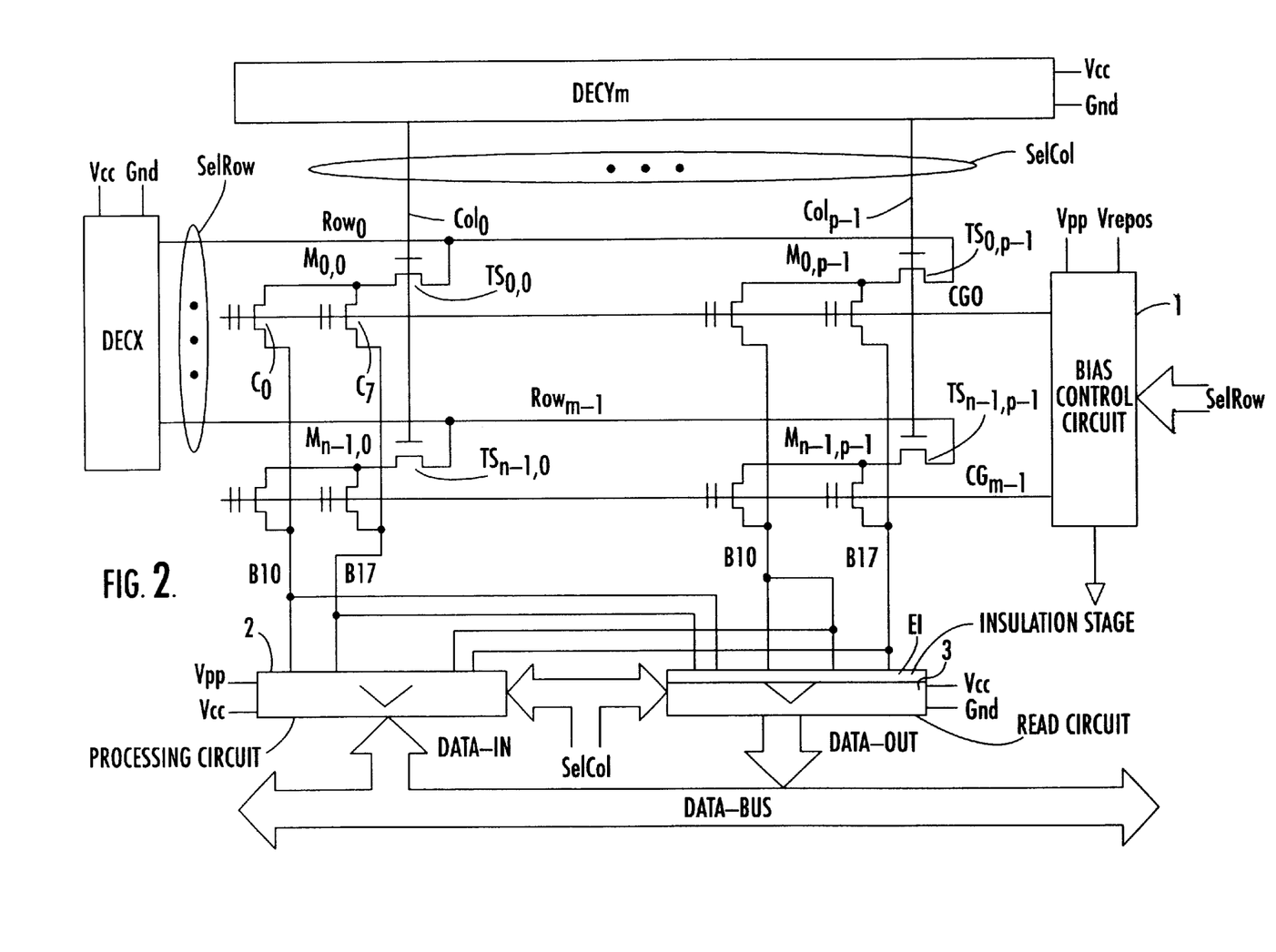
FIG. 2 is a general diagram of an exemplary embodiment of a memory architecture according to the present invention, highlighting the separation between the memory cell selection circuits and the switching circuits for switching the high voltage to the memory cells.

FIG. 2 shows an exemplary embodiment of a non-volatile memory architecture with a word-based organization according to the present invention. The memory architecture includes a matrix of n rows $Row_0$ to $Row_{n-1}$ and p columns $Col_0$ to $Col_{p-1}$, with n and p being integers. The memory effect MOS transistor of each cell is a floating-gate transistor, with a control gate and two channel electrodes, i.e., a drain and a source.

Each memory word groups together k cells in the same row. In a typical example, and as shown in FIG. 2, k=8. Each memory word then has eight cells C0 to C7. Each memory word is connected to a row and to a word column by an associated selection transistor. Each memory word thus has a memory cell and an associated word selection transistor. For example, the word $M_{0,0}$ is connected to the row $Row_0$, and to the word column $Col_0$ by the associated selection transistor $TS_{0,0}$.

In the exemplary architecture shown in FIG. 2, the channel electrode connected to the bit lines of the memory is the drain. The selection transistor of each word is thus connected to the other electrode, namely the source in the example, of the memory cells forming this word. Hereinafter, and for simplicity of the explanation, reference shall be made to the example shown. Word selection is performed by switching the high voltage to the drains of the cells. Those skilled in the art will be able to apply the teaching of the present invention to architectures in which the source is the channel electrode connected to the bit lines.

The decoding of a memory address and the selection of a corresponding word in the matrix are thus directly performed by the low-voltage selection signals SelCol and SelRow delivered at the output of the column decoder DECYm and the row decoder DECX. These signals are directly applied to the selection transistors of the matrix. In the example, each selection transistor has its control gate controlled by a corresponding column selection signal, and its drain controlled by a corresponding row selection signal. For example, the selection transistor $TS_{0,0}$ of the memory word $M_{0,0}$ receives respectively, at its gate and its source, the column selection signal $Selcol_0$ and the row selection signal $Selrow_0$. Thus, in an architecture of this kind, each row of the matrix is formed by the common source line of the selection transistors of this row, and each column is formed by the common gate line of the word selection transistors of this column.

The structure of a memory word according to the invention includes for the source common to the cells of each word, a selection of the word by this common source. Each memory cell has its drain connected to a bit line of the memory array. Its control gate is common with the control gates of the cells of the entire row for forming a control gate line. The source of each memory cell is connected to the selection transistor of the associated word. In the example, they are connected to the drain of the associated selection transistor. For example, each of the memory cells C0, C1, ... C7 of the memory word $M_{0,0}$ has its drain connected to a respective bit line, Bl0, Bl1, ... Bl7, while the sources of these cells are connected in common with and are controlled by the associated selection transistor $TS_{0,0}$, and their gates are connected to (formed by) the control gate line CG0.

In this architecture, therefore, in parallel with each row of the memory, there is a common control gate line of the cells of this row. The control gate lines $CG_0, \ldots CG_{n-1}$ of the matrix are controlled by a bias control circuit 1. This circuit receives, as inputs, the row selection logic signals $selRow_0, \ldots, selRow_{n-1}$ given by the row decoder DECX. To each control gate line, the row decoder applies a bias voltage corresponding to the operation to be performed, either the high voltage Vpp or an idle voltage Vrepos.

Since these control gate lines are no longer on the path of the selection of the memory cells, they may be grouped together, for example, in sets of two. Each group of control gate lines is then controlled by a single high-voltage switching circuit of the bias circuit 1. If the lines are grouped in sets of two, the number of high-voltage switching circuits needed is halved.

If it is assumed that a row Rowi is selected in the-programming mode, the group of control gate lines to which the control gate line Cgi associated with the selected row $Row_i$ belongs receives the high programming voltage. The control gate lines of all the other groups receive an idle voltage. This idle voltage is appiied to the lines of all the groups if the operation for which a row has been selected is a read operation, or if no operation is in progress. The level of the idle voltage is typically equal to or smaller than the level of the logic supply voltage Vcc. It will be seen further below that it is advantageous to take the level of idle voltage to be the level of the read bias voltage.

In the same way as with the control gate lines, it is possible to group the bit lines together. In the example, the matrix comprises p columns (or data banks) and n rows. The matrix therefore comprises p groups of bit lines. Each group has as many bit lines as there are cells in a word, in the example, k=8 for bit lines Bl0 to Bl7. These groups of bit lines Bl0–Bl7 are connected, first, to a programming circuit 2 which receives the data to be programmed DATA-IN, and secondly, to a read circuit 3 which gives the data read at the output DATA-OUT. The programming circuit 2 comprises high voltage switching circuits to apply the high voltage Vpp or ground Gnd to at least one group of bit lines, as a function of the input data DATA-IN to be programmed.

Preferably, each of the switching circuits is shared with at least two groups of bit lines. In this way, the number of high voltage circuits needed is halved. When this is done, a very high gain in terms of space is achieved. This aspect of the invention shall be explained in greater detail with reference to FIG. 3. The read circuit 3 typically has bit line precharging circuits and detection circuits comprising differential amplifiers, by which the state of the cells of the word selected in the read mode is output as the data DATA-OUT.

Figure 3:
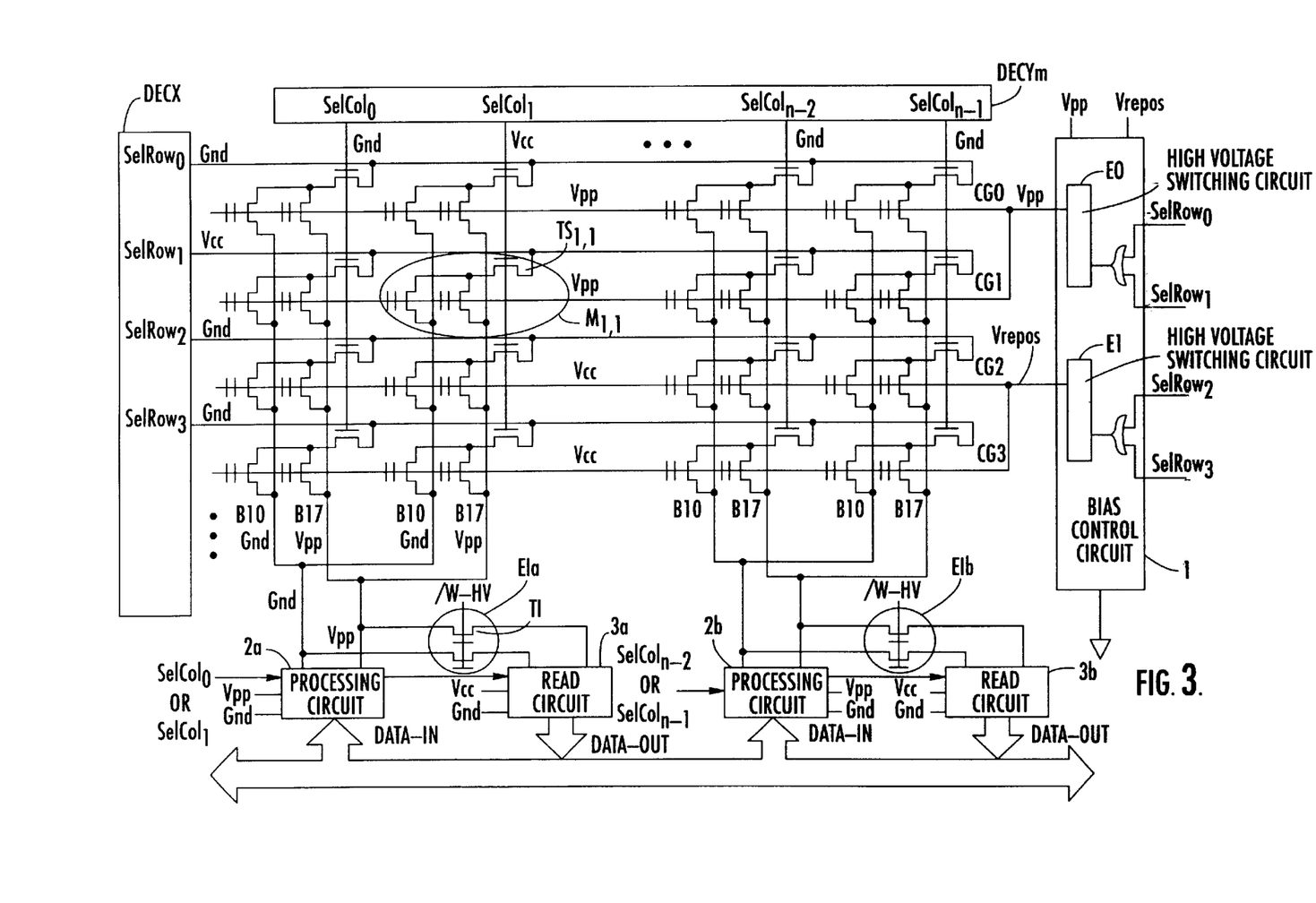
FIG. 3 is a detailed drawing of an exemplary embodiment of the memory architecture illustrated in FIG. 2.

As shall be seen also with reference to FIG. 3, the grouping of the bit lines is applicable in a way similar to that of the programming circuit 2. In each of the circuits, namely the programming circuit 2 and the read circuit 3, only one stage is active at the same time, corresponding to the column selection (or databank selection) made. Thus, the information on the column selection SelCol is input into these two circuits.

Since this is the read circuit, this column selection signal is preferably applied only for the selection of the detection circuit which is itself associated with the column selected for reading. Thus, when the operations are not write operations, the precharging circuits may be activated even before the start of a read cycle. In other words, the bit line precharging time is taken out of the read cycle. This is especially advantageous in multiple reading modes in which several read operations are performed successively.

Similarly, when no programming operation is in progress, it has been seen that by default, the control gate line biasing circuit 1 takes all these lines to an idle voltage, independently of the row selection made. Preferably, the level of this idle voltage is equal to the level of a read voltage to be applied to the memory cells in the reading mode. Thus, if a read operation is received, the control gates are already biased at the right voltage. Thus, there is a gain in the precharging time for these capacitive gates. This is made possible because the memory cells are no longer selected by their gates.

In this way, let it be assumed that all the words of a row of the memory are read successively. We then have a precharging phase common to all the groups of bit lines (without there being any selection), and then successive read cycles in which only the detection circuit changes. This depends on the group of bit lines selected for each cycle. The duration of the read cycle becomes equal to the duration of selection of the detection circuit and of the detection.

FIG. 2 furthermore shows an insulation stage EI at the input of the read circuit 3. It is preferable to prevent the high voltage applied to the bit lines by the programming circuit 2 from affecting the read circuit 3 during the programming operations. As described in detail in FIG. 3, which shows two read circuits 3a and 3b respectively associated with the groups of bit lines Bl0–Bl7 of the columns $Col_0$ and $Col_1$ for the circuit 3a and the columns $Col_{p-2}$ and $Col_{p-1}$ for the circuit 3b, an associated isolation stage EIa, EIb comprises one isolation transistor TI per set of pooled bit lines. These transistors are controlled by the same high programming voltage signal referenced/W-HV. All the isolation transistors are controlled by the same control signal. This requires a single additional high-voltage switching circuit to give this control signal from the programming control signal W.

FIG. 3 more particularly shows an exemplary grouping of bit lines and control gates for a memory architecture according to the invention. It gives a detailed view of the first four rows $Row_0$ to $Row_3$ of the matrix, and the first two columns $Col_0$ and $Col_1$ and the last two columns $Col_{p-2}$, $Col_{p-1}$ of the matrix. In this example, there is a grouping of bit lines in two adjacent columns and a grouping of control gate lines in two adjacent rows. Thus, the lines B10 of the columns $Col_0$ to $Col_1$ are connected together, the lines B11 of these two columns are connected together and so on up to the lines Bl7 of these two columns which are connected together. Similarly, the control gate lines CG0 and CG1 of the rows $Row_0$ and $Row_1$ are connected together, the control gate lines CG2 and CG3 are connected together and so on for the entire memory array.

The grouped control gate lines are controlled by the same high-voltage switching circuit for the bias circuit 1. The high-voltage switching circuit associated with each group of control gate lines is controlled by a logic circuit which receives, at an input, each of the row selection signals corresponding to the lines of the concerned group. Thus, in the example shown, the high-voltage switching circuit E0 controls the group of the control gate lines CG0 and CG1. The switching command for this circuit E0 is given by a logic circuit, an OR gate in the example, which receives the selection signals of the rows $SelRow_0$ and $SelRow_1$ as inputs.

The upper limit on the number of controlling gate lines that can be grouped together according to the invention depends on the memory size and the resulting equivalent capacitance. Indeed, it is necessary to achieve a compromise between the gain in surface area, the charging time for this capacitance and the stress induced to bring the grouped control gate lines from the level of the idle voltage to the level of the high-voltage Vpp.

As for the bit lines, two observations may be made. The first observation is that it is possible to reserve the grouping of the bit lines solely for the programming circuit 2. It is then necessary to provide for a short-circuit transistor between the bit lines to be pooled to activate this configuration only in the programming mode (not shown). These transistors will be controlled in a complementary way with respect to the isolation transistors TI at the input of the read circuit. This variation does not give rise to an additional switching circuit.

The second observation is that, if the grouping of the bit lines were to be applied also to the read circuit, the precharging current generator would have to be sized appropriately. If there are two bit lines to be precharged in common by the same circuit, in order not to slow down the precharging, this precharging circuit would have to give the usual precharging current twice. Here too, the choice of the number of grouped bit lines is determined as a function of the possible compromises between precharging time and quantity of injectable current (dimensions of the transistors).

Figure 4:
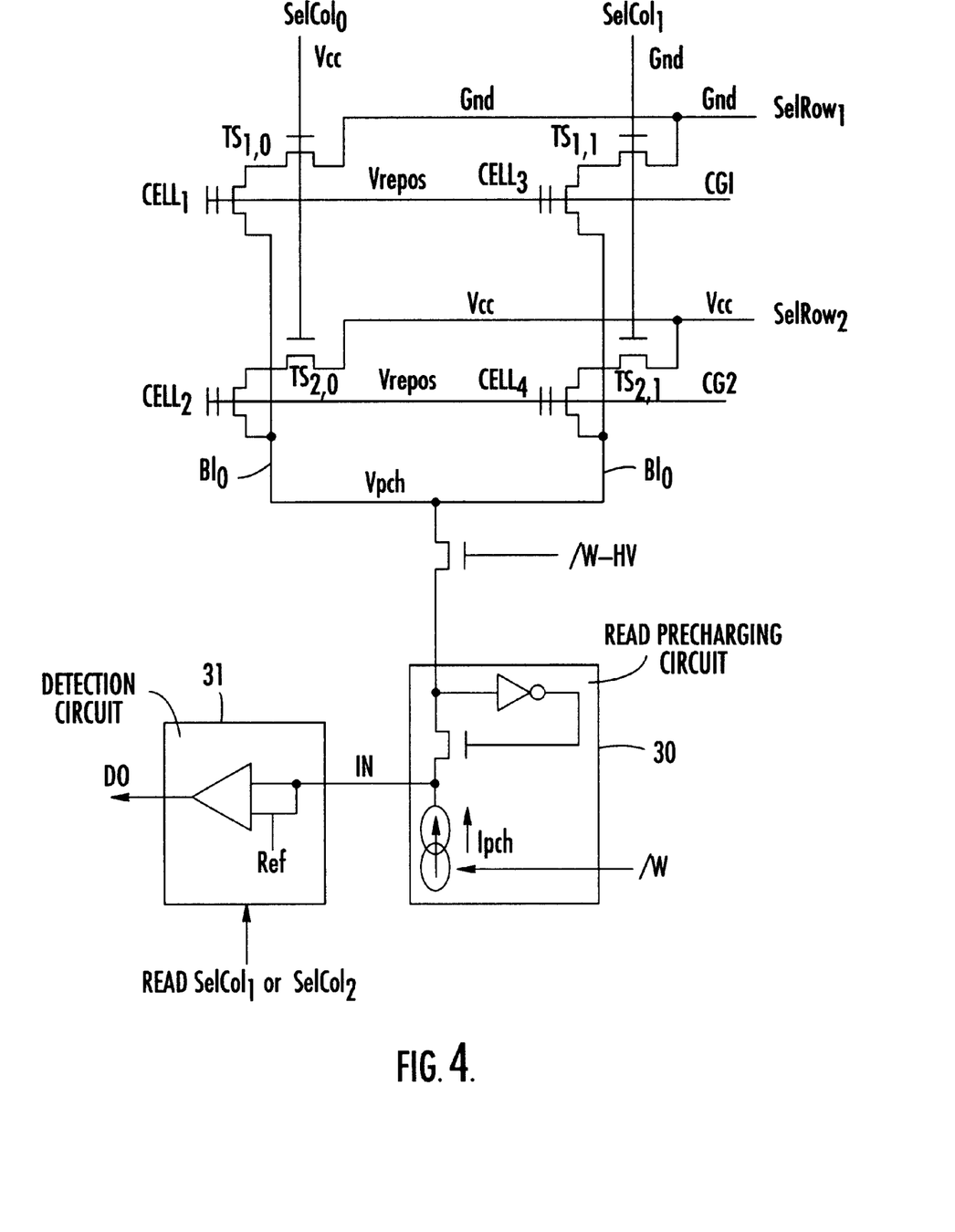
FIG. 4 is a diagrammatic view of an exemplary embodiment of a read circuit associated with a group of two bit lines in a memory architecture according to the present invention.

With regard to the mode of operation of an architecture of this kind, reference may be made to FIG. 4 for the operation in the read mode. This figure shows the cells connected to the bit lines Bl0 of two adjacent columns Col0 and Col1 and two adjacent rows Row1 and Row2. In the example, the bit line Bl0 of the column Col0 and the bit line of the column Col1 are pooled together according to the principle of the invention.

In the column $Col_0$ there is thus a first cell $Cell_1$ on the row $Row_1$ and a second cell $Cell_2$ on the row $Row_2$. On the column $Col_1$ there is thus a first cell $Cell_3$ on the row $Row_1$, and a second cell $Cell_4$ on the row $Row_2$. If there is a read operation on the word defined by $Col_0$, $Row_1$, the cells $Cell_1$ as selected, especially in the read mode by the selection signals SelCol0 and SelRow1 applied to the associated selection transistor $TS_{1,0}$.

The bit lines Bl0 of the columns $Col_0$ to $Col_1$ are precharged by the same read circuit precharging circuit 30 at an identical precharging voltage Vpch, by the injection of a current Ipch and by the action of the feedback loop CIV of the precharging circuit. The precharging circuit is connected between the two bit lines BL0 pooled together and the input IN of the amplifier of the associated detection circuit 31. The control gates CG1 and CG2 of the rows $Row_1$ and $Row_2$ are already biased at the idle voltage, which has preferably been taken by the bias control circuit 1 to be equal to the bias voltage.

Hereinafter, it is assumed that the two low-voltage logic levels are Gnd and Vcc. It has been seen that the high logic level could be lower than Vcc, for example, equal to ⅔ of Vcc, depending on the memory technology used. Those skilled in the art will be able to apply the following to the different technologies. The column decoder imposes Vcc on the selected column $Col_0$ (SelCol0=1), and Gnd on the other columns. The row decoder imposes Gnd on the selected row $Row_1$ (SelRow1=0) and puts the other rows in a state of high impedance.

Thus, only the cell $Cell_1$ can conduct, depending on its state. The other cells cannot conduct. Indeed, the selection transistors associated with the cells $Cell_2$, $Cell_3$ and $Cell_4$ do not conduct any current at all. They therefore leave the source potential of the cells in the floating state. It will be noted that all the bit lines of the matrix are precharged at Vpch, without there being any selection in the read mode.

The operation in the programming mode is explained with reference to FIG. 3. If there is an operation for programming data DATA-IN on the word M1 defined by $Col_1$, $Row_1$, the cells of this word are selected in the programming mode. The other cells of this architecture are in no way affected by the levels of the programming voltage applied.

With the row $Row_1$ being selected, the switching circuit 1 applies the high voltage to the gate lines CG0 and CG1 which are grouped together. The other gates, like the gates CG2 and CG3, are at Vcc by default. With the column $Col_1$ being selected, the high programming voltage or ground is applied to the bit lines Bl1 to Bl7 of the columns $Col_0$ and $Col_1$. The bit lines of these columns are grouped in sets of two. The level applied to each of them depends on the data DATA-IN to be programmed. In the example, the bit lines BL0 of the two columns are both taken to Vpp, corresponding to an input data bit D0 at 0, and the bit lines Bl7 of the two columns are brought to Gnd, corresponding to an input data bit D7 at 1.

With only the column $Col_1$ being selected, Vcc is at the gate of the selection transistors of this column and Gnd at all the other gates. With only the row Row1 being selected, Gnd is at the source of the selection transistors of this row and Vcc (or Vcc+Vt) is at all the others. Thus, only the selection transistor $TS_{1,1}$ associated with the word $M_{1,1}$ is on and draws the source of the cells of the memory word to ground. This activates the programming by hot electrons, of the cells whose drain (the bit line) is at Vpp, with the control gate furthermore being at Vpp.

The other cells have their source at a floating potential. The other cells of the matrix are not stressed because none of them has to withstand an excessively large potential difference at the terminals, whether it is located on the selected column on not, or on a selected row or not, as can be seen in FIG. 3 where the voltage levels of the different elements have been shown.

In the example, an operation of writing in the memory has been described. The invention can also be applied in the case of a write operation corresponding to an erasure. With regard to the possibility of electrically erasing memory cells with an architecture of this kind, it must be noted that this erasure can be obtained only by the application of a high voltage to the source. This is not necessarily compatible with all the non-volatile memory cell technologies. It is also possible to consider the application of the high voltage by the bulk portion of the transistors forming the cells.

The memory architecture according to the invention that has just been described in a particular embodiment therefore enables the use of fewer high-voltage switching circuits and improves the read access time. It can be applied to all non-volatile memory technologies. It can be extended to architectures in which the source/drain functions of the memory cells are reversed.

That which is claimed is:

1. A non-volatile memory comprising:
    an array of memory cells arranged in rows and columns, and organized in words, each word being defined by a plurality of memory cells in a same row, and each memory cell comprising a memory effect transistor including a control terminal, a first conducting terminal, and a second conducting terminal;
    bit lines connected to the first conducting terminals of said memory effect transistors;
    an address decoder for providing a row-selection signal and a column-selection signal for selecting a word;
    a plurality of control terminal lines connected to the control terminals of said memory effect transistors, each respective control terminal line being connected in common to the control terminals of said memory effect transistors of a same row; and
    a plurality of selection transistors connected to the second conducting terminals of said memory effect transistors, each selection transistor for selecting a respective word, and being controlled by the row-selection signal and the column-selection signal for selecting the respective word.

2. A non-volatile memory according to claim 1, further comprising a bias circuit connected to said plurality of control terminal lines, said bias circuit having an input for receiving the row-selection signals.

3. A non-volatile memory according to claim 2, wherein the row-selection and column-selection signals are low-voltage signals; and wherein said bias circuit comprises a plurality of high-voltage switching circuits providing high voltage signals relative to the low-voltage signals; wherein said plurality of control terminal lines are grouped together in at least groups of two, each group of control terminal lines being controlled by a respective high-voltage switching circuit; and wherein each high-voltage switching circuit receives the row-selection signals corresponding to the control terminal lines of the group.

4. A non-volatile memory according to claim 3, wherein the grouped together control terminal lines correspond to adjacent rows.

5. A non-volatile memory according to claim 3, wherein each high-voltage switching circuit provides at least one of a high-voltage signal and an idle voltage signal to the grouped together control terminal lines associated therewith, the high-voltage signal corresponding to a write command for a selected row.

6. A non-volatile memory according to claim 5, wherein the idle voltage signal corresponds to a non-write operation.

7. A non-volatile memory according to claim 5, wherein a level of the idle voltage signal is equal to a level of a bias voltage applied by said bias circuit to the grouped together control terminal lines for a read command.

8. A non-volatile memory according to claim 1, wherein each column includes a group of bit lines associated therewith, each group of bit lines including a respective bit line per data bit to be written or read; and wherein same-ranking bit lines of at least two columns in different groups are connected in common.

9. A non-volatile memory according to claim 8, wherein the at least two columns whose same-ranking bit lines are grouped together are in adjacent groups.

10. A non-volatile memory according to claim 8, further comprising a plurality of read circuits, each read circuit connected to a respective group of bit lines and comprising:
a read precharging circuit connected to one of the respective groups of bit lines, and including an input for receiving an activation command before a start of a read cycle or a start of a succession of read cycles; and
a detection circuit connected to said read precharging circuit and comprising at least one differential amplifier for providing data read from a selected memory cell.

11. A non-volatile memory according to claim 10, wherein each read precharging circuit takes all of the bit lines within a respective group of bit lines to a same precharging voltage.

12. A non-volatile memory according to claim 10, further comprising a respective isolation circuit connected between a read circuit and a group of bit lines associated with said read circuit, and each isolation circuit being activated during a write operation.

13. A non-volatile memory according to claim 1, wherein the non-volatile memory is configured as an integrated circuit.

14. A non-volatile memory comprising:
an array of memory cells arranged in rows and columns, and organized in words, each word being defined by a plurality of memory cells in a same row, and each memory cell comprising a memory effect transistor including a control terminal, a first conducting terminal, and a second conducting terminal;
bit lines connected to the first conducting terminals of said memory effect transistors;
an address decoder for providing a low-voltage row-selection signal and a low-voltage column-selection signal for selecting a word;
a plurality of control terminal lines connected to the control terminals of said memory effect transistors and being grouped together in at least groups of two, each respective control terminal line being connected in common to the control terminals of said memory effect transistors of a same row;
a bias circuit connected to said plurality of control terminal lines and comprising a plurality of high-voltage switching circuits providing a high voltage signal relative to the low-voltage row-selection signal and to the low-voltage column-selection signal, each group of control terminal lines being controlled by a respective high-voltage switching circuit; and
a plurality of selection transistors connected to the second conducting terminals of said memory effect transistors,
each selection transistor for selecting a respective word, and being controlled by the low-voltage row-selection signal and the low-voltage column-selection signal for selecting the respective word.

15. A non-volatile memory according to claim 14, wherein each high-voltage switching circuit receives the row-selection signals corresponding to the control terminal lines of the group associated therewith.

16. A non-volatile memory according to claim 14, wherein the grouped together control terminal lines correspond to adjacent rows.

17. A non-volatile memory according to claim 14, wherein each high-voltage switching circuit provides at least one of a high-voltage signal and an idle voltage signal to the grouped together control terminal lines associated therewith, the high-voltage corresponding to a write command for a selected row.

18. A non-volatile memory according to claim 17, wherein the idle voltage signal corresponds to a non-write operation.

19. A non-volatile memory according to claim 17, wherein a level of the idle voltage signal is equal to a level of a bias voltage applied by said bias circuit to the grouped together control terminal lines for a read command.

20. A non-volatile memory according to claim 14, wherein each column includes a group of bit lines associated therewith, each group of bit lines including a respective bit line per data bit to be written or read; and wherein same-ranking bit lines of at least two columns in different groups are connected in common.

21. A non-volatile memory according to claim 20, wherein the at least two columns whose same-ranking bit lines are grouped together are in adjacent groups.

22. A non-volatile memory according to claim 20, wherein said non-volatile memory further comprises a plurality of read circuits, each read circuit connected to a respective group of bit lines and comprising:
a read precharging circuit connected to one of the respective groups of bit lines, and including an input for receiving an activation command before a start of a read cycle or a start of a succession of read cycles; and
a detection circuit connected to said read precharging circuit and comprising at least one differential amplifier for providing data read from a selected memory cell.

23. A non-volatile memory according to claim 22, wherein each read precharging circuit takes all of the bit lines within a respective group of bit lines to a same precharging voltage.

24. A non-volatile memory according to claim 22, wherein said non-volatile memory further comprises a respective isolation circuit connected between a read circuit and a group of bit lines associated with said read circuit, and each isolation circuit being activated during a write operation.

25. A method for operating a non-volatile memory comprising an array of memory cells arranged in rows and columns and organized in words, each memory cell comprising a memory effect transistor; a plurality of control terminal lines connected to control terminals of the memory effect transistors, each control terminal line being connected in common to control terminals of the memory effect transistors of a same row; bit lines connected to first conducting terminals of the memory effect transistors; a plurality of control terminal lines connected to the control terminals of the memory effect transistors; and a plurality of selection transistors connected to second conducting terminals of the memory effect transistors, each selection transistor for selecting a respective word, the method comprising:

selecting a word in the array of memory cells by providing a low-voltage row-selection signal and a low-voltage column-selection signal to a corresponding selection transistor, and a high-voltage to the bit lines connected to the first conducting terminals of the memory effect transistors forming the selected word; and writing data to the selected word by providing a high-voltage to a control terminal line connected to the control terminals of the memory effect transistors forming the selected word.

26. A method according to claim 25, wherein the nonvolatile memory further comprises a bias circuit connected to the plurality of control terminal lines, the bias circuit having an input for receiving the row-selection signals.

27. A method according to claim 26, wherein the bias circuit comprises a plurality of high-voltage switching circuits; wherein the plurality of control terminal lines are grouped together in at least groups of two, each group of control terminal lines being controlled by a respective high-voltage switching circuit; and wherein each high-voltage switching circuit receives the row-selection signals corresponding to the control terminal lines of the group.

28. A method according to claim 27, wherein the grouped together control terminal lines correspond to adjacent rows.

29. A method according to claim 27, wherein each high-voltage switching circuit provides at least one of a high-voltage and an idle voltage to one of the grouped together control terminal lines associated therewith.

30. A method according to claim 29, wherein the idle voltage corresponds to a non-write operation.

31. A method according to claim 29, wherein a level of the idle voltage is equal to a level of a bias voltage applied by the bias circuit to one of the grouped together control terminal lines for a read command.

32. A method according to claim 25, wherein each column includes a group of bit lines associated therewith, each group of bit lines including a respective bit line per data bit to be written or read; and wherein same-ranking bit lines of at least two columns in different groups are connected in common.

33. A method according to claim 32, wherein the at least two columns whose same-ranking bit lines are grouped together are in adjacent groups.

34. A method according to claim 34, wherein the nonvolatile memory further comprises a plurality of read circuits, each read circuit connected to a respective group of bit lines; and further comprising reading the selected word by precharging the respective group of bit lines for the selected word based upon receiving an activation command before a start of a read cycle or a start of a succession of read cycles; and providing data read from the selected word.

35. A method according to claim 34, wherein each read precharging circuit takes all of the bit lines within a respective group of bit lines to a same precharging voltage.

36. A method according to claim 34, further comprising providing isolation between a read circuit and a group of bit lines associated with the read circuit during the writing data.

* * * * *